(12) United States Patent
Tadayon et al.

(10) Patent No.: US 11,262,384 B2
(45) Date of Patent: Mar. 1, 2022

(54) FINE PITCH PROBE CARD METHODS AND SYSTEMS

(71) Applicant: Intel Corporation, Santa Clara, CA (US)

(72) Inventors: Pooya Tadayon, Portland, OR (US); David Shia, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 67 days.

(21) Appl. No.: 16/461,387

(22) PCT Filed: Dec. 23, 2016

(86) PCT No.: PCT/US2016/068470
§ 371 (c)(1),
(2) Date: May 16, 2019

(87) PCT Pub. No.: WO2018/118075
PCT Pub. Date: Jun. 28, 2018

(65) Prior Publication Data
US 2019/0310287 A1    Oct. 10, 2019

(51) Int. Cl.
*G01R 1/073* (2006.01)
*G01R 31/28* (2006.01)

(52) U.S. Cl.
CPC ..... *G01R 1/07342* (2013.01); *G01R 1/07357* (2013.01); *G01R 1/07371* (2013.01); *G01R 31/2886* (2013.01)

(58) Field of Classification Search
CPC ............ G01R 1/07342; G01R 1/07357; G01R 1/07371; G01R 31/2886; G01R 3/00;
(Continued)

(56) References Cited

U.S. PATENT DOCUMENTS 3,622,387 A   11/1971   Grandadam
4,581,260 A   4/1986    Mawla
(Continued)

FOREIGN PATENT DOCUMENTS

EP   0962776    12/1999
JP   11-344510  12/1999

OTHER PUBLICATIONS

Darling, K.A. et al., "Mitigating grain growth in binary nanocrystalline alloys through solute selection based on thermodynamic stability maps", Computational Material Science; 84 (2014), 255-266.
(Continued)

*Primary Examiner* — Lee E Rodak
(74) *Attorney, Agent, or Firm* — Essential Patents Group, LLP.

(57) ABSTRACT

An embodiment includes an apparatus comprising: a substrate including a surface that comprises first, second, and third apertures; and first, second, and third probes comprising proximal ends that are respectively included within and project from the first, second, and third apertures; wherein the first, second, and third probes: (a)(i) intersect a plane that is generally coplanar with the surface, (a)(ii) include distal ends configured to contact electrical contacts of a device under test (DUT), and (a)(iii) are generally linear and each include a major axis that is non-orthogonal to the plane. Other embodiments are described herein.

10 Claims, 4 Drawing Sheets

(58) Field of Classification Search
CPC .............. G01R 1/0675; G01R 1/07314; G01R 1/06733; G01R 1/06738; G01R 1/06716; G01R 1/07378; G01R 31/2891; G01R 1/06705; G01R 1/06722; G01R 1/06744; G01R 1/073; G01R 1/07307; G01R 1/0735; G01R 31/2601; G01R 31/2805; G01R 31/2887; G01R 31/2889; H01R 12/714; H01R 11/18

See application file for complete search history.

(56) References Cited

U.S. PATENT DOCUMENTS

| | | | |
|---|---|---|---|
| 5,307,560 A * | 5/1994 | Aksu | H05K 13/028 29/593 |
| 5,453,701 A | 9/1995 | Jensen et al. | |
| 5,592,222 A | 1/1997 | Nakamura et al. | |
| 5,747,999 A | 5/1998 | Yamaoaka | |
| 5,767,692 A * | 6/1998 | Antonello | G01R 1/07371 324/755.05 |
| 5,917,329 A | 6/1999 | Cadwallader et al. | |
| 6,130,545 A | 10/2000 | Kiser et al. | |
| 6,292,004 B1 | 9/2001 | Kocher | |
| 6,356,090 B2 * | 3/2002 | Deshayes | G01R 1/07342 324/756.03 |
| 6,441,315 B1 | 8/2002 | Eldridge et al. | |
| 6,740,163 B1 | 5/2004 | Curtiss et al. | |
| 6,774,654 B2 | 8/2004 | Kanamaru et al. | |
| 6,812,718 B1 | 11/2004 | Chong et al. | |
| 7,189,077 B1 | 3/2007 | Eldridge et al. | |
| 7,436,193 B2 | 10/2008 | Crippen | |
| 7,566,228 B2 | 7/2009 | Chiu | |
| 7,884,632 B2 * | 2/2011 | Shiraishi | G01R 1/06727 324/750.25 |
| 7,928,522 B2 | 4/2011 | Zhu et al. | |
| 8,029,291 B2 | 10/2011 | Park | |
| 8,267,831 B1 | 9/2012 | Olsen et al. | |
| 8,411,550 B2 | 4/2013 | Chou et al. | |
| 9,227,324 B1 | 1/2016 | Abdul Rashid et al. | |
| 2002/0024347 A1 * | 2/2002 | Felici | G01R 1/07357 324/750.25 |
| 2002/0163349 A1 | 11/2002 | Wada et al. | |
| 2005/0151547 A1 * | 7/2005 | Machida | G01R 1/07371 324/754.03 |
| 2005/0231855 A1 | 10/2005 | Tran | |
| 2005/0263401 A1 | 12/2005 | Olsen et al. | |
| 2006/0151614 A1 | 7/2006 | Nishizawa et al. | |
| 2006/0171425 A1 | 8/2006 | Lee et al. | |
| 2006/0214674 A1 | 9/2006 | Lee et al. | |
| 2007/0126435 A1 | 6/2007 | Eldridge et al. | |
| 2007/0126440 A1 | 6/2007 | Hobbs et al. | |
| 2007/0290371 A1 | 12/2007 | Chen | |
| 2008/0074132 A1 | 3/2008 | Fan et al. | |
| 2008/0088327 A1 | 4/2008 | Kister | |
| 2008/0196474 A1 | 8/2008 | Di Stefano et al. | |
| 2008/0204061 A1 * | 8/2008 | Chartarifsky | G01R 1/07342 324/755.05 |
| 2008/0231300 A1 | 9/2008 | Yamada et al. | |
| 2008/0309363 A1 | 12/2008 | Jeon et al. | |
| 2009/0219047 A1 | 9/2009 | Peterson et al. | |
| 2009/0237099 A1 | 9/2009 | Garabedian et al. | |
| 2010/0052715 A1 * | 3/2010 | Beaman | G01R 1/0735 324/754.01 |
| 2010/0066393 A1 | 3/2010 | Bottoms et al. | |
| 2010/0079159 A1 | 4/2010 | Kemmerling | |
| 2010/0276572 A1 | 11/2010 | Iwabuchi et al. | |
| 2011/0031991 A1 | 2/2011 | Lee et al. | |
| 2011/0115513 A1 | 5/2011 | Harada | |
| 2011/0234251 A1 | 9/2011 | Komatsu et al. | |
| 2012/0038383 A1 | 2/2012 | Wu et al. | |
| 2012/0071037 A1 | 3/2012 | Balucani | |
| 2012/0100287 A1 | 4/2012 | Wong | |
| 2012/0117799 A1 | 5/2012 | Luo | |
| 2012/0319710 A1 | 12/2012 | Dabrowiecki et al. | |
| 2013/0002285 A1 | 1/2013 | Nelson et al. | |
| 2013/0099812 A1 | 4/2013 | Wang et al. | |
| 2013/0200910 A1 | 8/2013 | Ellis-Monaghan et al. | |
| 2013/0285688 A1 * | 10/2013 | Namburi | G01R 1/06716 324/750.25 |
| 2014/0021976 A1 * | 1/2014 | Tanaka | G01R 1/07357 324/754.11 |
| 2014/0125372 A1 | 5/2014 | Fukasawa et al. | |
| 2014/0253162 A1 | 9/2014 | Wang | |
| 2014/0347085 A1 | 11/2014 | Kuo et al. | |
| 2014/0362425 A1 | 12/2014 | Stephens et al. | |
| 2014/0363905 A1 | 12/2014 | McShane et al. | |
| 2015/0123693 A1 * | 5/2015 | Ota | G01R 1/07357 324/756.05 |
| 2015/0192633 A1 | 7/2015 | Garibay et al. | |
| 2016/0079635 A1 | 3/2016 | Niwa | |
| 2016/0178663 A1 * | 6/2016 | Prabhugoud | G01R 1/0466 324/750.24 |
| 2016/0223590 A1 | 8/2016 | Hsu et al. | |
| 2017/0219626 A1 | 8/2017 | Gardell et al. | |
| 2018/0003767 A1 * | 1/2018 | Crippa | G01R 31/2891 |
| 2019/0203370 A1 | 7/2019 | Walczyk et al. | |
| 2019/0212366 A1 | 7/2019 | Tadayon et al. | |
| 2020/0006868 A1 | 1/2020 | Tillotson, Jr. | |
| 2020/0025801 A1 | 1/2020 | Tadayon et al. | |
| 2021/0302489 A1 | 9/2021 | Tadayon | |

OTHER PUBLICATIONS

Luo, J.K. et al., "Young's modulus of electroplated Ni thin film for MEMS applications", Materials Letters, vol. 58, Issues 17-18, Jul. 2004, pp. 2306-2309.

"Probe card"; lasted edited on Jul. 29, 2016, 2 pages, Wikipedia, https://en.wikipedia.org/wiki/Probe_card.

Weeden, et al., "Probe Card Tutorial", www.tek.com/keithley, 2003, 40 pages, Keithley Instruments, Inc.

International Searching Authority, "Notification of Transmittal of the International Search Report and the Written Opinion of the International Searching Authority," dated Aug. 4, 2017, in International application No. PCT/US2016/068470.

* cited by examiner

FINE PITCH PROBE CARD METHODS AND SYSTEMS

CLAIM OF PRIORITY

This Application is a National Stage Entry of, and claims priority to, PCT Patent Application No. PCT/US2016/068470, filed on Dec. 23, 2016 and titled "FINE PITCH PROBE CARD METHODS AND SYSTEMS which is incorporated by reference in its entirety for all purposes.

TECHNICAL FIELD

Embodiments of the invention concern methods and systems for providing electrical contacts. Such methods and systems concern, for example, probe cards used in testing circuits.

BACKGROUND

As addressed in U.S. Pat. No. 7,436,193, assigned Intel Corp. of Santa Clara, Calif., USA, electronic components, such as microprocessors, are becoming increasingly complex. The more complex an electrical component becomes, the greater number of semiconductor device fabrication steps needed to form the electrical component. Semiconductor devices, such as microprocessors, are generally made from a wafer of semiconductive material. Many individual semiconductor devices are formed on a single wafer. Hundreds of individual semiconductor processes, which may include deposition of material, ion implantation, etching, and photolithographic patterning, are conducted on a wafer to form a number of individual semiconductor devices. The wafers are sizeable. As a result, the effectiveness of each semiconductive process on each device may vary somewhat. In addition, each step or semiconductive process used to form the devices is not necessarily uniform. Generally, the semiconductive process has to perform within a desired range. The end result due to variations in the semiconductive processes as well as the variation in position is that the semiconductive devices formed may vary from one wafer to another. In addition, the semiconductive devices may vary from other semiconductive devices on the wafer.

A manufacturer may elect test the semiconductor devices on a wafer prior to singulation. Various tests may be conducted. For example, a first test is conducted to determine if any of the individual semiconductive devices on the wafer are bad. A second test is conducted to determine a performance parameter for the good semiconductive devices on the wafer. Wafers may have hundreds to thousands of devices. Each of these devices may be tested to determine if the device is good. The speed of the device maybe determined in a second test. Once measured, the speed of the device may be saved and the location of the device on the wafer is noted. This information may be used to sort the device based on performance at the time the wafer is sliced and diced to form individual dies (e.g., single square or rectangular piece of semi-conductor material onto which a specific electrical circuit has been fabricated, also called a chip), each of which has a device thereon.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Figure 1:
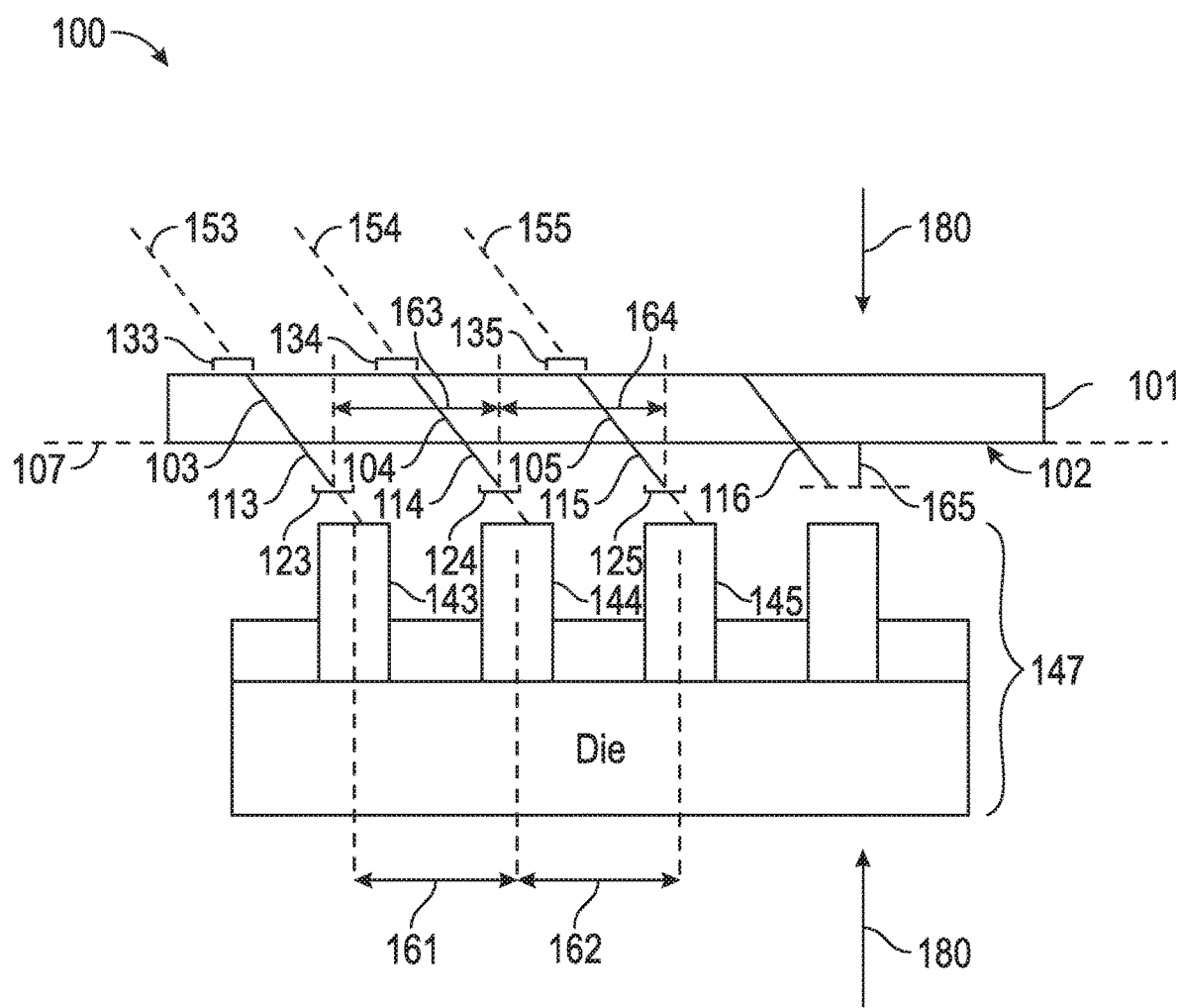
FIG. 1 includes a side view of a probe card in an embodiment.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Applicant determined that as silicon bump pitch scales to smaller and smaller dimensions, the ability to provide a probing solution that meets the mechanical and electrical requirements becomes more and more challenging given that the mechanical and electrical needs drive the solution in diametrically opposed directions. For instance and as explained in more detail below, electrically a solution drives for short/fat probes but mechanically the solution drives for long/thin probes. This problem is exacerbated as products scale bump pitch from 100 um to 40 um or less.

Applicant determined metrics for a successful probe technology include, but are not limited to, (1) current carrying capability (CCC), (2) over-travel capability (vertical distance measurement of probe holder calculated from the location of the probe holder when the probe first makes contact with the device under test (DUT) and the final location of the probe holder), and (3) contact resistance (Cres) (resistance that occurs at the junction between the probe tip and the device contact surface metallization).

As a side note regarding overdrive or overtravel, to overcome nonplanarity among contacts and to assure good electrical contact by passing through any oxidation layer on the contacts, the probes are driven into the device. In other words, the probes are pressed into the die or DUT to assure that the each electrical contact is contacted by a probe tip (e.g., tip 124 of FIG. 1), and to assure that the oxidation layer has been punctured, so that good electrical contact is made.

Applicant determined a variable that is heavily impacted by probe scaling is CCC, which degrades exponentially as probe cross-section is reduced to accommodate smaller pitches. Applicant determined a CCC of 1 Amp, in some instances, is needed to accommodate aggressively scaled DUTs (e.g., DUTs with bump pitch less than 40 microns). To achieve such a CCC at very fine pitches, Applicant recognized a problem: such a pitch requires very short probes (which are effectively stubs instead of springs) that problematically lack the mechanical properties required to make robust, repeatable contact with the bumps.

However, embodiments address the above issues. For instance, an embodiment allows for very short probes that also have desirable mechanical behaviors. Such an embodiment can scale down to less than 40 um bump pitch and still maintain a robust CCC. One such embodiment includes a straight, short probe that is held at an angle non-orthogonal to the substrate (probe holder) that holds the probe. As a result of the angle, the probe acts like a spring (despite its relatively short length) when a vertical force is applied to it.

Such a linear angled probe provides advantages over conventional probes that use long probes that are specifically shaped (e.g., include curves, coils, or bends) to behave like a spring. Applicant determined such conventional probes do not scale well with tight pitches (e.g., bump pitches of less than 50 microns) because as the wire geometry shrinks: (1) CCC degrades substantially, (2) neighboring probes begin to interfere with each other due to natural fabrication variations, and (3) because of the length of the probe, small placement errors at the base (i.e., at the probe holding substrate) translate into relatively large positional errors at the tip (i.e., portion of probe that contacts the DUT), thus making it extremely difficult to make contact with a small bump. Regarding (3), conventional best-in-class radial positional accuracy is approximately, 15 um but to support sub-40 um bump pitch, radial positional error can be no larger than a few microns.

FIG. 1 includes an embodiment that addresses the above mentioned issues. FIG. 1 includes an apparatus 100 comprising a substrate 101 (also called a probe holder) including a surface 102 that comprises first, second, and third apertures 103, 104, 105. First, second, and third probes 113, 114, 115 comprise proximal ends 133, 134, 135 that are respectively included within and project from the first, second, and third apertures. The first, second, and third probes 113, 114, 115: (a)(i) are coplanar with a plane 107 that intersects the surface 102, (a)(ii) include distal ends 123, 124, 125 configured to contact electrical contacts 143, 144, 145 of a DUT 147, and (a)(iii) are generally linear and each include a major axis 153, 154, 155 that is non-orthogonal to the plane.

Figure 2:
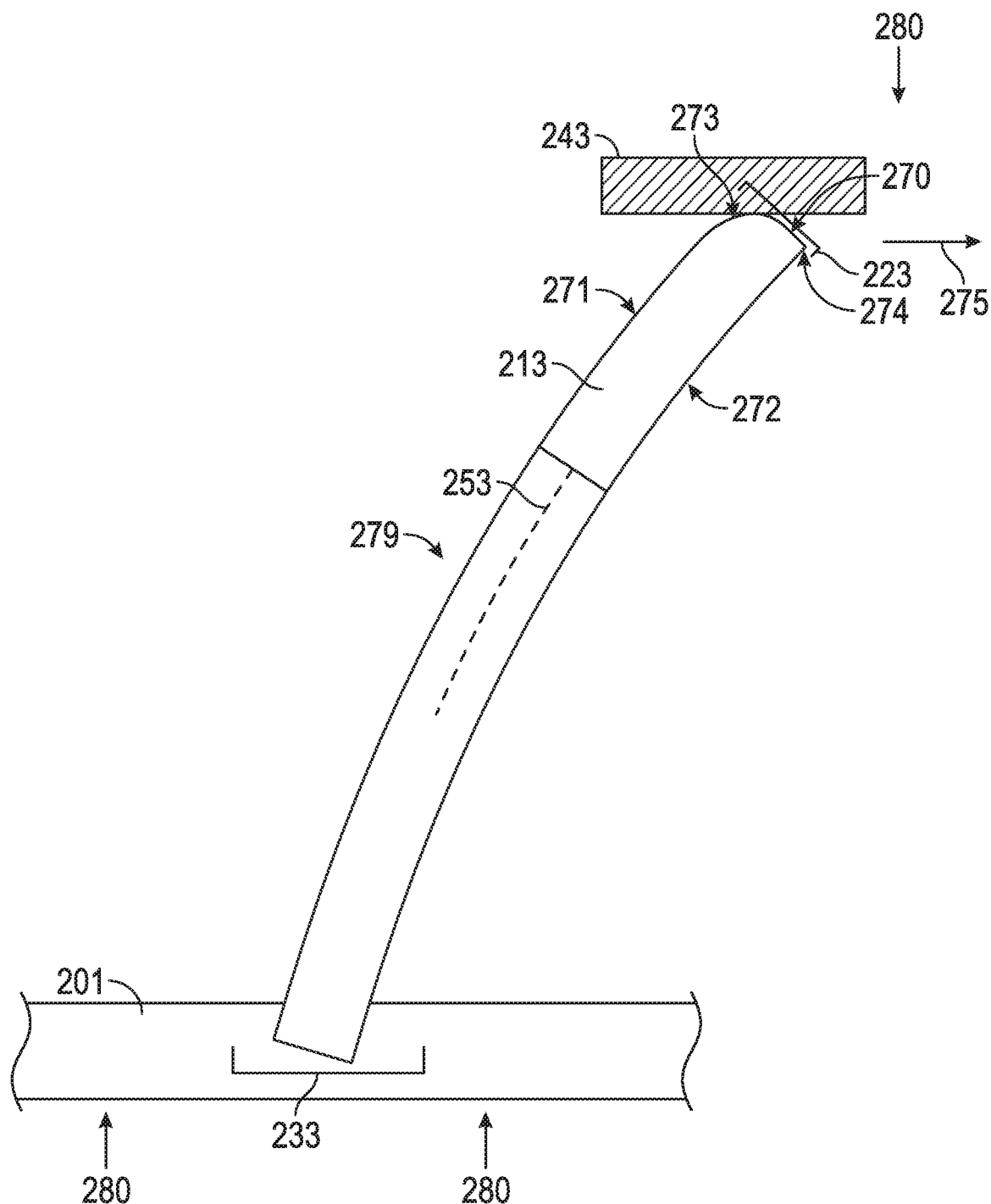
FIG. 2 includes a side view of a probe in an embodiment.

The first, second, third, and additional probes (e.g., probe 116) have a pitch that is less than 50 microns. As seen in FIG. 2, (b)(ii) the probe pitch (e.g., distances 163, 164) defines a distance from a center of the distal end of the first probe 113 to a center of the distal end of the second probe 114. No other probe is located between the first and second probes 113, 114 as the first and second probes are adjacent one another. In an embodiment, the bump pitch (e.g., distances 161, 162) equals the probe pitch.

In FIG. 1 each of the first, second, and third probes 113, 114, 115 includes: (c)(i) a distance 165, measured orthogonal to the surface 102 and from the surface to the distal ends 123, 124, 125 of each of the first, second, and third probes, which is less than 1,000 microns, and (c)(ii) a diameter which is less than 40 microns.

CCC for probes 113, 114, 115 is based on, in the least, probe material, probe dimensions, and probe Cres. Material properties for the probes may be a function of temperature, which then depends on the current being applied. Each of the first, second, and third probes 113, 114, 115 includes a CCC of at least 0.75 amperes (although in other embodiments the CCC for each probe is 0.5, 0.6, 0.7, 0.8, 0.9, 1.0 amperes or more). The CCC for the probes may be due in part to the substrate including alumina, aluminum nitride, and/or silicon nitride and the probes each including nickel, beryllium, tungsten, rhenium, copper and/or combinations thereof.

As seen in FIG. 2, the distal end 223 of probe 213 includes a distal-most surface 270 that contacts sidewalls 271, 272 of probe 213 at first and second opposing edges 273, 274. Probe 213 is oriented with respect to the substrate 201 such that only one of the first and second opposing edges 273, 274 (i.e., edge 273 in FIG. 2) is configured to contact the electrical contact 243 of the DUT.

In an embodiment, edge 273 is configured to scrub (see scrub direction 275) electrical contact 243 of the DUT in a direction non-collinear with major axis 253 of probe 213 (when probe 213 is not bent and axis 253 is linear). Regarding scrubbing, to test all the semiconductive devices on a wafer at once, many, if not all of the electrical contacts, are contacted. For example, testing a number of individual contacts on a wafer commonly requires thousands of different individual contacts to be made across the surface of the wafer. Testing each contact requires more than merely touching each electrical contact. An amount of force must be applied to a contact to break through any oxide layer that may have been formed on the surface of the contact. Forming thousands of contacts which are not all at the same height and not all in the same plane is also difficult. As a result, a force has to be applied to the contacts to assure good electrical contact (and scrub away oxide) and to compensate for the lack of planarity among the contacts.

In an embodiment, edge 273 may be rounded (and/or edge 274 may be rounded in some embodiments). The rounding may be present before any probing has commenced (e.g., probing may be formed by the probe manufacturer) or may be formed over time due to scrubbing. The round corner can be produced by the manufacturer before probing commences by using a polishing process. The rounded edge minimizes the chance of damaging contact 243 due to an overly deep trough formed during scrubbing. However, in other embodiments corners/edges 273, 274 may be sharp initially or formed into some specific shape like a wedge, blade, crown, and the like. However, one of the edges may round over time as it contacts contact pads at an angle. Over repeated contacts and scrub motions, the corner in contact (e.g., corner 273) will be rounded out.

In FIG. 2, probe 213 includes a middle section 279 (between proximal and distal ends 233, 223) configured to flex during over-travel corresponding to the DUT. In other words, as overtravel occurs the flex of probe 213 allows for resiliency that is temporary (to avoid harming the DUT while still providing scrubbing) and not permanent (so as to avoid ruining the probe). Overtravel occurs due to force 180 (FIG. 1)/280 (FIG. 2) moving the substrate 201 towards the DUT, the DUT towards the substrate, or both.

In an embodiment the proximal and distal ends and the middle section for each of the first, second, and third probes are collinear with each other before contact to the DUT (and subsequent overtravel occurs) occurs, but in other embodiments the probes may not be linear and may be curved or rounded.

Figure 3:
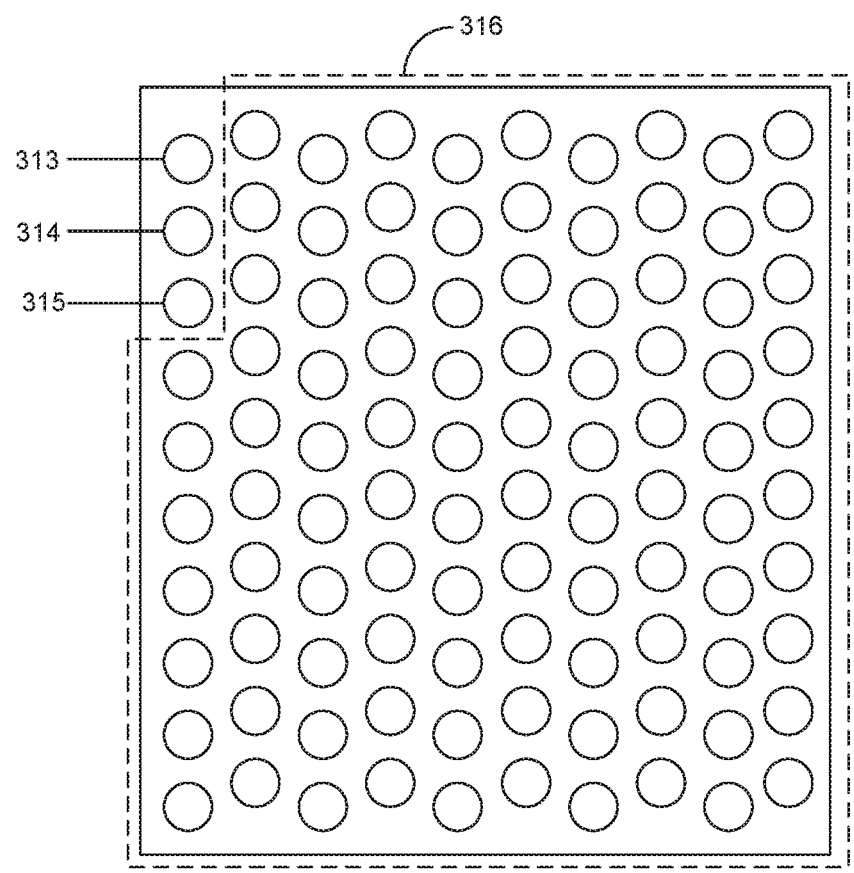
FIG. 3 includes an array of probes in an embodiment.

FIG. 3 includes an embodiment whereby probes 316 in addition to the first, second, and third probes 313, 314, 315 are oriented in an array having at least three columns and at least three rows. The array of FIG. 3 corresponds to a typical C4 bump array pattern. Only a portion of additional probes 316 are shown considering, for example, a 10 mm×10 mm die with contact bumps at 40 um pitch may have 62,500 bumps. Further, some products use mixed patterns. For example, the bump pattern around the edge of the die (where the input/output nodes are) may be different than the bump pattern in the interior of the die where power and/or ground bumps reside.

In an embodiment, the probe holder/substrate (e.g., substrate 101 of FIG. 1) is created by drilling holes in the substrate at an angle. The holes are then filled with a straight wire which acts as a natural spring (due to flex in, for example, mid portion 279) when a vertical force is applied to it.

Thus, embodiments described herein provide improvements over conventional systems because they: (1) scale to sub-40 um bump pitch while still meeting electrical and mechanical requirements, (2) provide simple, low cost manufacturing (i.e., since the probes are straight wires their manufacture is simplified and probe inspection can be simplified to just measuring the wire length—all of which increases yield plus manufacturing throughput, which in turn ultimately drives down cost), (3) the probe inherently has a large scrub which is desirable to achieve low and stable Cres, (4) because of the short length of the probe, the radial positional error at the tip is very small and thus allows the technology to scale to a contact pitch of less than 40 um. Such embodiments provide probe cards that use angled vias in a substrate as the probe holder, resulting in naturally angled wires that can act as springs when a vertical force is applied to them.

An embodiment includes a process for manufacturing a probe card. First, begin with a substrate. The substrate may include a low coefficient of thermal expansion (CTE) and a high modulus material. Such a substrate may include alumina, aluminum nitride, silicon nitride, or other material suitable for laser machining. Second, the substrate is placed on a 6-axis hexapod capable of tilting the substrate up to 60 degrees (however a hexapod is just one implementation and other embodiments use a tilt stage stacked on top of a rotary stage to achieve the same results). Third, the hexapod or stacked stage is located inside a laser machining system capable of drilling high accuracy and high precision holes (e.g., Oxford Laser, Inc. probe drill system). Fourth, the x and y coordinates of the probes are entered into the machine along with the desired angle and the tool drills the array holes at the appropriate angle into the substrate. Fifth, once all the holes have been drilled, the wires are located in the holes. Because a simple linear wire is being used in some embodiments a wirebonder can be used to stuff each hole with wire of appropriate length. Sixth, additional post processing may be required to permanently attach the probes to the substrate and planarize the overall system. In other embodiments, the "wires" may be created using plating, build-up, or additive manufacturing processes.

Figure 4:
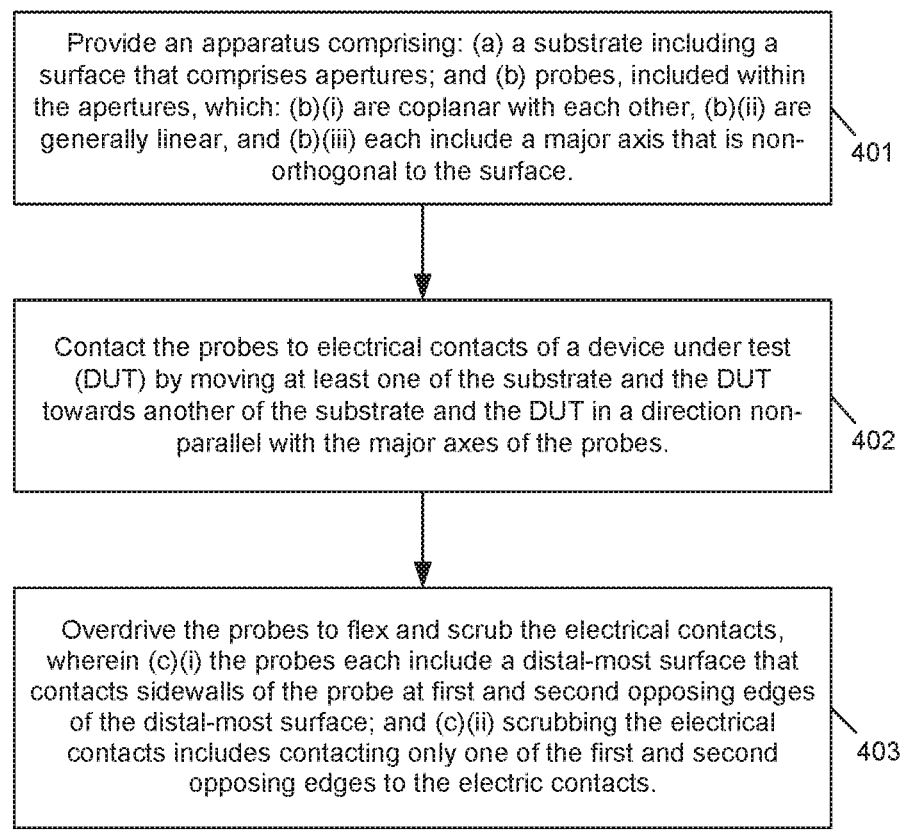
FIG. 4 includes a method in an embodiment.

FIG. 4 includes a method 400 in an embodiment.

Block 401 comprises providing an apparatus comprising: (a) a substrate including a surface that comprises apertures; and (b) probes, included within the apertures, which: (b)(i) are coplanar with each other, (b)(ii) are generally linear, and (b)(iii) each include a major axis that is non-orthogonal to the surface.

Block 402 includes contacting the probes to electrical contacts of a device under test (DUT) by moving at least one of the substrate and the DUT towards another of the substrate and the DUT in a direction non-parallel with the major axes of the probes.

Block 403 includes overdriving the probes to flex and scrub the electrical contacts, wherein (c)(i) the probes each include a distal-most surface that contacts sidewalls of the probe at first and second opposing edges of the distal-most surface; and (c)(ii) scrubbing the electrical contacts includes contacting only one of the first and second opposing edges to the electric contacts.

While many embodiments have been discussed with regard to probe cards, not all embodiments are limited to probe cards. For example, angle probe system embodiments described herein may be found in sockets used for backend test manufacturing, such as burn-in sockets, class test sockets, system test sockets, and the like. These sockets generally use vertical micro-springs but, in some embodiments, angle probe systems addressed herein are scaled for use in these applications. Angle probe systems described herein may also be used sockets for end use applications, such as sockets that receive PCB cards and the like. For instance, a desktop computing system may use angled probe systems in sockets that receive PCB cards and/or chip packages.

The following examples pertain to further embodiments.

Example 1 includes an apparatus comprising: a substrate including a surface that comprises first, second, and third apertures; and first, second, and third probes comprising proximal ends that are respectively included within and project from the first, second, and third apertures; wherein the first, second, and third probes: (a)(i) are coplanar with a plane that intersects the surface, (a)(ii) include distal ends configured to contact electrical contacts of a device under test (DUT), and (a)(iii) are generally linear and each include a major axis that is non-orthogonal to the plane.

While many examples have depicted linear probes other embodiments may include bent probes or curved probes that interface the probe holder substrate at angles that are not orthogonal to the main plane that generally defines the outer surface of the probe holder (e.g., surface 102).

Another version of example 1 includes an apparatus comprising: a substrate including a surface that comprises first, second, and third apertures; and first, second, and third probes comprising proximal ends that are respectively included within and project from the first, second, and third apertures; wherein the first, second, and third probes: (a)(i) intersect a plane that is generally coplanar with the surface, (a)(ii) include distal ends configured to contact electrical contacts of a device under test (DUT), and (a)(iii) are generally linear and each include a major axis that is non-orthogonal to the plane.

Example 2 includes the apparatus of example 1 comprising additional probes in addition to the first, second, and third probes, wherein: (b)(i) the first, second, third, and additional probes have a pitch that is less than 50 microns, (b)(ii) the pitch defines a distance from a center of the distal end of the first probe to a center of the distal end of the second probe, (b)(iii) no other probe is located between the first and second probes as the first and second probes are adjacent one another.

Example 3 includes the apparatus of example 2 wherein each of the first, second, and third probes includes: (c)(i) a distance, measured orthogonal to the surface and from the surface to the distal end of each of the first, second, and third probes, which is less than 1,000 microns, and (c)(ii) a diameter that is less than 40 microns.

Example 4 includes the apparatus of example 3 wherein each of the first, second, and third probes includes a current carrying capability (CCC) of at least 0.75 amperes.

Example 5 includes the apparatus of example 2 wherein: (d)(i) the distal ends of the first, second, and third probes each include a distal-most surface, (d)(ii) the distal-most surface of each of the first, second, and third probes contacts sidewalls of the first, second, and third probes at first and second opposing edges of the distal-most surfaces, and (d)(iii) the first, second, and third probes are oriented with respect to the substrate such that only one of the first and second opposing edges of each of the first, second, and third probes is configured to contact the electrical contacts of the DUT.

Example 6 includes the apparatus of example 5 wherein the only one of the first and second opposing edges of each of the first, second, and third probes is configured to scrub the electrical contacts of the DUT in a direction non-collinear with the major axes of the first, second, and third probes.

Example 7 includes the apparatus of example 5 wherein the only one of the first and second opposing edges of each of the first, second, and third probes is rounded.

Example 8 includes the apparatus of example 5 wherein each of the first, second, and third probes includes a middle section configured to flex during over-travel corresponding to the DUT.

Example 9 includes the apparatus of example 8, wherein the proximal and distal ends and the middle section for each of the first, second, and third probes are collinear with each other.

Example 10 includes the apparatus of example 9 wherein the apparatus includes a probe card.

Example 11 includes the apparatus of example 10 wherein: the substrate includes a member selected from the group consisting of alumina, aluminum nitride, silicon nitride, and combinations thereof; and the first, second, and third probes each include a member selected from the group consisting of nickel, beryllium, tungsten, rhenium, copper and combinations thereof.

Example 12 includes the apparatus of example 2 wherein the first, second, third, and additional probes are oriented in an array having at least three columns and at least three rows.

Example 13 includes a method comprising: providing an apparatus comprising: (a) a substrate including a surface that comprises apertures; and (b) probes, included within the apertures, which: (b)(i) are coplanar with each other, (b)(ii) are generally linear, and (b)(iii) each include a major axis that is non-orthogonal to the surface; and contacting the probes to electrical contacts of a device under test (DUT) and then, afterwards, overdriving the probes to flex and scrub the electrical contacts.

Another version of example 13 includes a method comprising: providing an apparatus comprising: (a) a substrate including a surface that comprises apertures; and (b) probes, included within the apertures, which: (b)(i) intersect a plane that is generally coplanar with the surface, (b)(ii) are generally linear, and (b)(iii) each include a major axis that is non-orthogonal to the plane; and contacting the probes to electrical contacts of a device under test (DUT) and then, afterwards, overdriving the probes to flex and scrub the electrical contacts.

Example 14 includes the method of example 13, wherein: the probes each include a distal-most surface that contact sidewalls of the probe at first and second opposing edges of the distal-most surface; and scrubbing the electrical contacts includes contacting only one of the first and second opposing edges to the electric contacts.

Example 15 includes the method of example 14, wherein contacting the probes to electrical contacts includes moving at least one of the substrate and the DUT towards another of the substrate and the DUT in a direction non-parallel with the major axes of the probes.

Example 16 includes an apparatus comprising: a substrate including a surface that comprises an aperture; and a probe comprising a proximal end that is included within the aperture; wherein the probe: (a)(i) intersects a plane that intersects the surface, (a)(ii) includes a distal end configured to contact an electrical contact of a device under test (DUT), and (a)(iii) is generally linear and includes a major axis non-orthogonal to the plane.

Another version of example 17 includes an apparatus comprising: a substrate including a surface that comprises an aperture; and a probe comprising a proximal end that is included within the aperture; wherein the probe: (a)(i) intersects a plane that is generally coplanar with the surface, (a)(ii) includes a distal end configured to contact an electrical contact of a device under test (DUT), and (a)(iii) is generally linear and includes a major axis non-orthogonal to the plane.

Example 17 includes the apparatus of example 16 wherein: (d)(i) the distal end of the probe includes a distal-most surface, (d)(ii) the distal-most surface contacts sidewalls of the probe at first and second opposing edges of the distal-most surface, and (d)(iii) the probe is oriented with respect to the substrate such that only one of the first and second opposing edges is configured to contact the electrical contact of the DUT.

Example 18 includes the apparatus of example 17 wherein the only one of the first and second opposing edges is configured to scrub the electrical contact of the DUT in a direction non-collinear with the major axis of the probe.

Example 19 includes the apparatus of example 18 wherein the probe includes a middle section configured to flex during over-travel corresponding to the DUT.

Example 20 includes the apparatus of example 19, wherein the proximal and distal ends and the middle section for the probe are collinear with each other.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
a substrate including a planar surface and through which first, second, and third apertures extend at an angle non-orthogonal to the planar surface, wherein the substrate comprises aluminum and oxygen, aluminum and nitrogen, or silicon and nitrogen, or a combination thereof; and
first, second, and third angled, straight wire probes comprising proximal ends that are respectively included within, and project a distance at the angle from only one side of, the first, second, and third apertures;
wherein:
the first, second, and third probes intersect a plane that is coplanar with the planar surface, include distal ends to contact electrical contacts of a device under test (DUT), and each of the probes has a major axis that is at an angle non-orthogonal to the plane;
each of the probes includes a middle section between the surface and the distal ends, the middle section to flex along the major axis in response to over-travel in a direction orthogonal to the plane of the substrate surface relative to the DUT; and
the distance, from the surface to the distal end of each of the probes is less than 1,000 microns.

2. The apparatus of claim 1, wherein each of the first second and third probes has a diameter less than 40 microns, and a pitch less than 40 microns.

3. The apparatus of claim 1, wherein the distal ends of the first, second, and third probes each include a distal-most surface that contacts a sidewall of the first, second, and third probes at first and second opposing edges, and wherein the first, second, and third probes are oriented with respect to the substrate to contact the electrical contacts of the DUT with only one of the first and second opposing edges of each of the first, second, and third probes.

4. The apparatus of claim 3, wherein the one of the first and second opposing edges of each of the first, second, and third probes is to scrub the electrical contacts of the DUT in a direction non-collinear with the major axes of the first, second, and third probes.

5. The apparatus of claim 3, wherein only the one of the first and second opposing edges of each of the first, second, and third probes is rounded.

6. The apparatus of claim 1, wherein
the first, second, and third probes each comprises nickel, beryllium, tungsten, rhenium, or copper or a combination thereof.

7. The apparatus of claim 1, wherein the first, second, third, and additional probes are within an array having at least three columns and at least three rows.

8. A method comprising:
providing the apparatus of claim 1;
contacting the probes to electrical contacts of the device under test (DUT); and
overdriving the probes to flex the probes and scrub the electrical contacts.

9. The method of claim 8, wherein:
the probes each include a distal-most surface that contacts a sidewall of the probe at first and second opposing edges of the distal-most surface; and
overdriving the electrical contacts comprises contacting only one of the first and second opposing edges to the electric contacts.

10. The method of claim 9, wherein contacting the probes to electrical contacts includes moving at least one of the substrate and the DUT towards another of the substrate and the DUT in a direction non-parallel with the major axes of the probes.

* * * * *